(12) United States Patent
Fastow et al.

(10) Patent No.: US 11,500,446 B2
(45) Date of Patent: Nov. 15, 2022

(54) REDUCING POWER CONSUMPTION IN NONVOLATILE MEMORY DUE TO STANDBY LEAKAGE CURRENT

(71) Applicant: Intel Corporation, Santa Clara, CA (US)

(72) Inventors: Richard Fastow, Cupertino, CA (US); Shankar Natarajan, Folsom, CA (US); Chang Wan Ha, San Ramon, CA (US); Chee Law, Belmont, CA (US); Khaled Hasnat, San Jose, CA (US); Chuan Lin, Cupertino, CA (US); Shafqat Ahmed, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 523 days.

(21) Appl. No.: 16/586,957

(22) Filed: Sep. 28, 2019

(65) Prior Publication Data

US 2021/0096634 A1    Apr. 1, 2021

(51) Int. Cl.
| | |
|---|---|
| *G06F 1/32* | (2019.01) |
| *G11C 16/04* | (2006.01) |
| *G11C 16/30* | (2006.01) |
| *G11C 16/32* | (2006.01) |
| *G11C 16/34* | (2006.01) |
| *G06F 1/3234* | (2019.01) |

(52) U.S. Cl.
CPC ........ *G06F 1/3275* (2013.01); *G11C 16/0483* (2013.01); *G11C 16/30* (2013.01); *G11C 16/32* (2013.01); *G11C 16/3459* (2013.01)

(58) Field of Classification Search
CPC ... G06F 1/3275; G11C 16/0483; G11C 16/30; G11C 16/32; G11C 16/3459
See application file for complete search history.

(56) References Cited

U.S. PATENT DOCUMENTS

| | | | |
|---|---|---|---|
| 2003/0133330 A1* | 7/2003 | Pekny | G11C 29/024 365/185.23 |
| 2008/0106299 A1 | 5/2008 | Oh | |
| 2009/0315591 A1 | 12/2009 | Pyeon et al. | |
| 2010/0309742 A1 | 12/2010 | Lee et al. | |
| 2013/0343138 A1 | 12/2013 | Kowalczyk | |
| 2014/0032956 A1 | 1/2014 | Caro et al. | |
| 2015/0078086 A1 | 3/2015 | Lee | |
| 2016/0189763 A1 | 6/2016 | Smith et al. | |
| 2017/0206031 A1* | 7/2017 | Yin | G06F 1/3275 |
| 2018/0335970 A1 | 11/2018 | Chen | |

\* cited by examiner

*Primary Examiner* — Stefan Stoynov
(74) *Attorney, Agent, or Firm* — Compass IP Law PC

(57) ABSTRACT

A nonvolatile memory supports a standby state where the memory is ready to receive an access command to execute, and a deep power down state where the memory ignores all access commands. The memory can transition from the standby state to the deep power down state in response to a threshold amount of time in the standby state. Thus, the memory can enter the standby state after a command and then transition to the deep power down state after the threshold time.

21 Claims, 9 Drawing Sheets

REDUCING POWER CONSUMPTION IN NONVOLATILE MEMORY DUE TO STANDBY LEAKAGE CURRENT

FIELD

Descriptions are generally related to nonvolatile memory, and more particular descriptions are related to reduction of standby leakage current in nonvolatile memory.

BACKGROUND

Nonvolatile memory devices include control circuitry to implement access and control logic on the memory die. From the perspective of manufacturing, CMOS (complementary metal oxide semiconductor) circuits are simple and inexpensive relative to other types of circuitry. CMOS circuits can also be scaled smaller. However, scaling CMOS circuits down in size can result in high standby leakage current. A nonvolatile memory spends a significant portion of time in a standby state. In the standby state the device is not actively accessing the memory, but the device is in a ready state to receive and execute a command. Leakage current refers to current used to maintain a ready state to receive a command, and refers to current that does not result in a memory access. Shrinking the CMOS circuitry to compress the footprint of the logic in the memory die results in a higher standby leakage current. Thus, as the CMOS circuitry is shrunk, the ratio of current used to perform active access in the memory device goes down.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a nonvolatile memory supports a standby state where the memory is ready to receive an access command to execute, and a deep power down state where the memory ignores all access commands. The memory can transition from the standby state to the deep power down state in response to a threshold amount of time in the standby state. Thus, the memory can enter the standby state after a command and then transition to the deep power down state after the threshold time.

Controlling the amount of time spent in standby and transitioning into deep power down (DPD) can reduce the leakage current in the memory die. Controlling the standby and DPD states can enable the further shrinking of circuitry in the memory die. In one example, the circuitry is control circuitry of the memory die. In one example, the control circuitry is CMOS (complementary metal oxide semiconductor) circuitry. A nonvolatile memory die has high voltage (HV) circuitry associated with the memory cells that store the data, and low voltage (LV) circuitry that provides various control functions. In one example, the control circuitry to manage with standby control is LV circuitry.

Controlling the transitioning of the memory die from standby to deep power down can reduce the impact of high standby leakage current caused by aggressive CMOS scaling. Transitioning from standby to DPD can control the leakage current while having minimal impact on read latency. The ability to manage the leakage current can enable scaling of control circuitry to result in smaller memory dies and lower die costs.

The transition from standby to DPD can replace traditional standby mode with a combination of a timed standby mode followed by a deep power down mode. Since the leakage current in DPD mode is minimal and significantly less than the leakage current in standby, such a procedure reduces overall power consumption. As long as the time spent in the timed standby mode is set to be much greater than the read time, the impact on read latency will also be minimal. Reference to a time being "much greater" can refer to a time that is at least five times another time. In one example, a time that is much greater than another time can be approximately an order or more of magnitude greater than a time being compared to.

Figure 1:
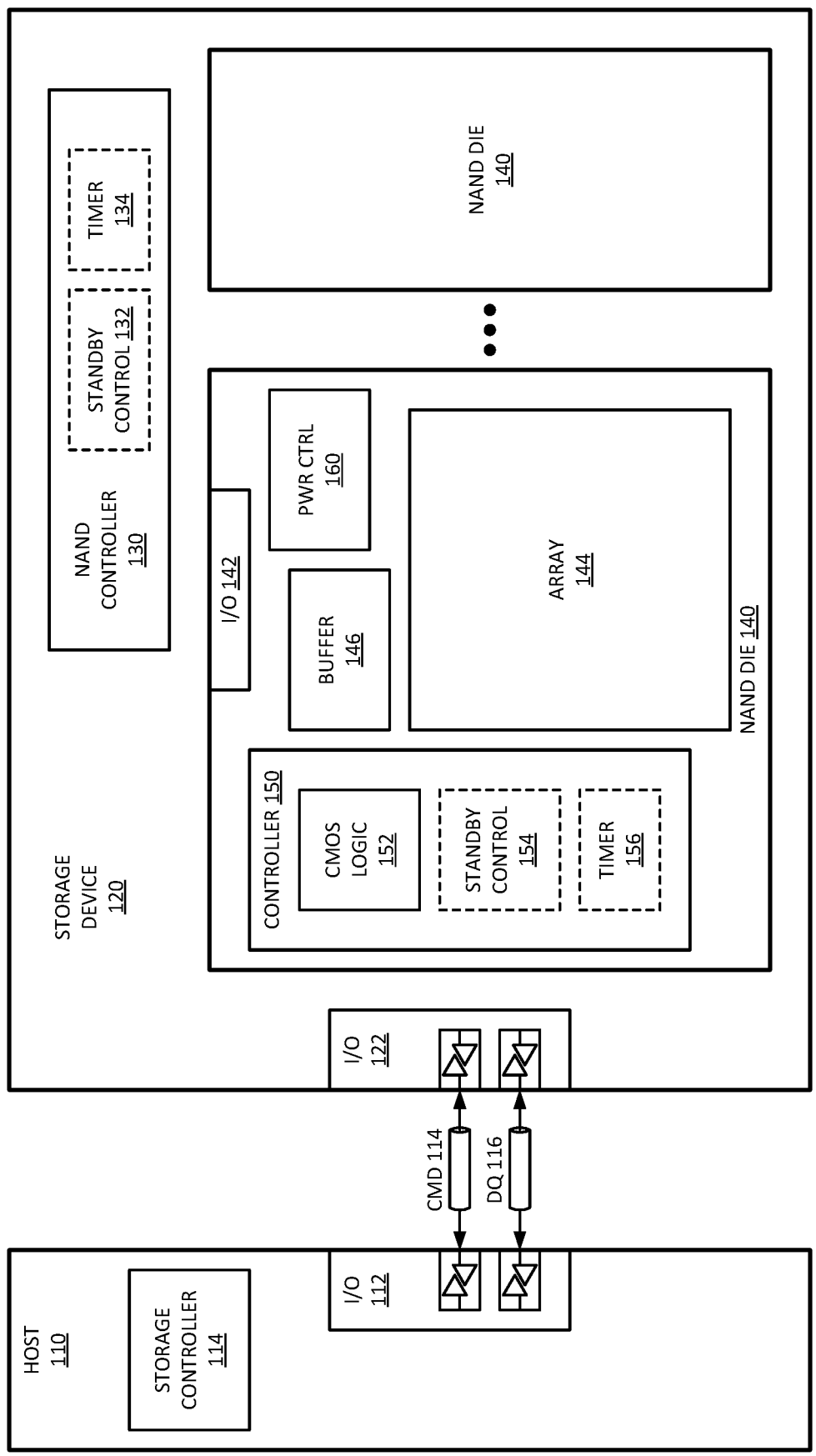
FIG. 1 is a block diagram of an example of a system with a storage device that includes standby timing control to transition from standby to deep power down.

FIG. 1 is a block diagram of an example of a system with a storage device that includes standby timing control to transition from standby to deep power down. System 100 represents a computing device with nonvolatile storage or nonvolatile memory. System 100 includes host 110, which represents a host platform for the computing device. Host 110 includes a host processor (not explicitly shown) that executes a host operating system (OS) to control the operation of system 100.

Host 110 includes I/O (input/output) hardware 112 or I/O 112 to couple to one or more storage devices 120. I/O 112 includes drivers and receivers, signal line interfaces, and other hardware components used to interface with nonvolatile memory. I/O 112 couples to corresponding I/O 122 of storage device 120, which can represent similar hardware components for bidirectional communication between host 110 and storage device 120. While not shown in detail, storage device 120 can include multiple storage dies such as NAND (not AND) dies 140, with I/O 142 that includes similar I/O hardware.

Host 110 includes storage controller 114, which represents logic within host 110 to control access to storage device 120. In one example, storage controller 114 couples to multiple storage devices 120. CMD (command) 116 represents one or more signal lines to enable storage controller 114 to send commands to storage device 120, such as an access command or a command related to setting a standby time threshold. DQ (data) 118 represents one or more signal lines to enable the exchange of data between host 110 and storage device 120.

Storage device 120 represents a device that provides nonvolatile storage of data for system 100. Nonvolatile (NV) storage or NV memory (NVM) refers to a memory device that maintains state even when power to the device is interrupted. Memory whose state is indeterminate when power to the device is interrupted is referred to as volatile memory. In one example, storage device 120 represents a device such as a solid state drive (SSD) that includes multiple nonvolatile memory dies. In one example, storage device 120 represents a multichip package that includes multiple NVM dies.

In one example, storage device 120 includes multiple NVM dies, represented by NAND dies 140. While NAND dies are provided as an example, it will be understood that other types of nonvolatile storage could be used. For example, NAND dies 140 could alternatively be NOR (no OR) dies. In one example, NAND dies 140 represent three dimensional (3D) crosspoint (3DXP) devices.

In one example, each NAND die 140 includes array 144, which represents an array of memory cells. In one example, NAND die 140 includes buffer 146, which represents a buffer between array 144 and I/O 142. Buffer 146 can provide transitional storage, such as registers or flops to hold data. In one example, buffer 146 holds write data for a write or program command to provide data to program array 144. In on example, buffer 146 holds read data read from array 144 to provide to host 110. In one example, buffer 146 represents a static page buffer (SPB). For example, the buffer can be or include multiple latches.

NAND die 140 includes controller 150, which represents control within the NAND die. Controller 150 can be or include a microcontroller or other control logic to manage the access to array 144. In one example, controller 150 includes CMOS logic 152 or other circuitry that has relatively high leakage current when NAND die 140 is in standby mode. It will be understood that controller 150 on NAND die 140 is different from NAND controller 130, which represents a storage controller for storage device 120. NAND controller 130 can manage the settings and access to multiple NAND dies 140 for a multi-die package or device.

Either controller 150 or NAND controller 130, or both, include logic to manage standby time. Logic in controller 150 is represented as standby control 154. Logic in NAND controller 130 is represented as standby control 132. Standby control 132 or standby control 152 provides standby control for NAND die 140. Standby control can determine how long after executing a command that NAND die 140 stays in standby before transitioning to deep power down. In one example, standby control 154 includes timer 156 to track the time NAND die 140 is in standby mode or in the standby state. In one example, standby control 132 includes timer 134 to track how long the die is in standby. In one example, NAND controller 132 could keep a separate timer for each NAND die 140. In one example, standby control 132 can track different timings for each NAND die 140 based on only one timer, or a fewer number of timers than there are NAND dies. In one example, even if the control is implemented with standby control 132, all timers will be on individual NAND dies 140.

Reference to the memory die staying in standby refers to a state or a mode for the memory die in which the memory die is not actively accessing array 144. While not accessing array 144, the currents and voltages of various data paths can be reduced. However, control circuitry remains powered to be prepared to receive and process a subsequent access command. The powering of the control circuitry can result in leakage current, but allows the system to provide quick access to a subsequent command.

Deep power down (DPD) refers to a state or a mode in which the memory die ignores all commands except commands to wake the memory die out of DPD. Thus, in DPD, NAND die 140 ignores all access commands. DPD has lower leakage than standby. For example, if DPD is controlled by a chip select or chip enable bit, the memory die can watch for the transition of that bit to wake from DPD, and does not need to keep circuitry awake to process any other commands. While standby can quickly respond to an access command, in DPD, NAND die 140 is essentially turned off, awaking from DPD requires additional initialization operations that increase latency.

Thus, one downside of putting a die into DPD mode is the latency associated with powering the die back up. Such a latency affects the average tRD (read time) as well as the quality of service (QoS). However, as the value of the timer is increased, the impact is minimized. In an example where the timer is set to a value at least equal to 5 times tRD, the average current can be similar to a low leakage case for a high leakage device.

In one example, the timer hardware is part of NAND die 140 and system 100 can set the timer value through control commands. In one example, the value of the threshold for timer 156 is dynamically programmable. The timer can, for example, be programmed with a threshold value and then count down. As another example, the timer can count up and comparison logic can determine when a threshold value is reached. The value can be set by the system based on memory technology (e.g., NAND memory cells, versus another memory technology), the application (e.g., the type of access to be expected), or other factors that can affect how long to leave the memory die in standby before transitioning to DPD.

In one example, the timer value or the threshold value can depend on the type of command NAND die 140 is executing. For example, the timer value can be different for an array command and an I/O command. It will be understood that an array command refers to an access command for the memory die in which the specific command is executed and then the command is completed. An I/O command refers to an access command that causes the memory die to execute the command, and also includes a trigger or a field to indicate that a subsequent command will be similar or the same as the command. Thus, after executing the command, the memory die is prepared to execute the same command again, which can be triggered without a specific command instruction. A specific field can indicate the start and the stop of an I/O command sequence.

Power control (PWR CTRL) 160 represents circuitry that controls the power usage of NAND die 140. Power control 160 can control the DPD state of NAND die 140. In one example, when in standby for a high leakage device, standby control (either 154 or 132) can manage a selected NAND die 140 to stay in standby for a predefined period as tracked by timer (either 156 or 134). In one example, after a threshold time in standby, standby control triggers the die to enter DPD. In one example, DPD can include gating the power to the devices with power gating circuitry. When the system changes from only using standby to using a combination of standby and DPD, the die can spend most of its time in DPD, but using standby first reduces the impact on read latency.

In one example, standby control checks the status of the die prior to transitioning from standby to DPD. For example, standby control can check to determine if the data in buffer 146 can be lost in either the read or program case prior to entering DPD. It will be understood that when entering DPD the power to buffer 146 will be gated and the data in the buffer will be lost. Thus, the system may transition NAND die 140 to DPD from standby only if the data can be lost. Such status control can depend on whether the data has been sent via I/O 142 for read (in which case the data is no longer needed in buffer 146), or if the data has been successfully programmed to array 144 (in which case the data is no longer needed in buffer 146).

It will be understood that when the data has been sent, checking the status of buffer 146 may not be necessary because it can be assumed that the data can be lost. In one example, the data in buffer 146 will be reused if the access is an I/O command, whereas for an array read the data in buffer 146 is not needed when the command completes.

Figure 2:
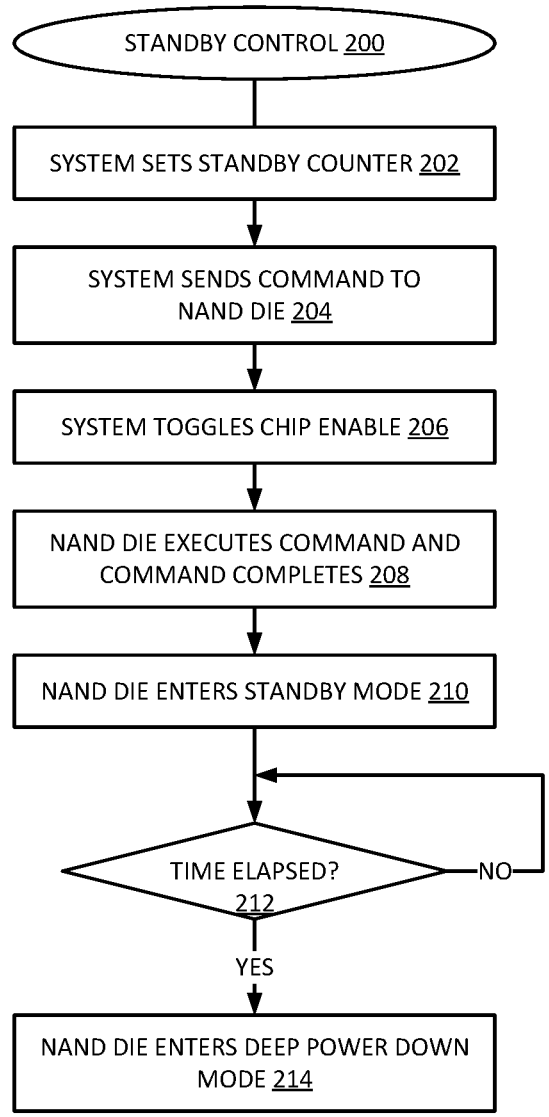
FIG. 2 is a flow diagram of an example of a process for transitioning from standby to deep power down.

FIG. 2 is a flow diagram of an example of a process for transitioning from standby to deep power down. Process 200 represents a standby control process to control transitioning a memory die from standby to DPD. Process 200 can be implemented by any example of standby control of system 100.

In one example, the system sets a standby counter or standby timer, block 202. The standby counter can indicate how long to stay in standby prior to transitioning to a DPD state. The system sends a command (or multiple commands) to the NAND die or other nonvolatile memory, block 204.

The system can toggle a chip enable or other enable signal to identify the die that should execute the command, block 206. The NAND die receives and executes the command, and the command completes, block 208. The NAND die can enter standby mode or standby state as traditionally would occur, block 210.

To reduce the impact of high standby leakage currents in devices with smaller geometries, in one example, the system limits the amount of time the die spends in standby mode. The storage device can monitor the amount of time based on the standby counter setting provided by the system. If the time indicated has not elapsed, block 212 NO branch, the storage device leaves the NAND die in standby.

In one example, in response to the time elapsing, block 212 YES branch, the NAND die enters DPD mode, block 214. In one example, the entry into DPD is automatic based on the timer, and is not in response to a command from the host or from the system. Rather, the determination to enter DPD can be made at the storage device itself. Traditionally, the host would indicate DPD based on factors other than the amount of time the NAND die has spent in standby. Placing the die into DPD mode after a given amount of time can reduce the impact of higher standby leakage current. Since the time spent in the standby mode is limited, the impact of standby leakage on the overall power is reduced.

Figure 3:
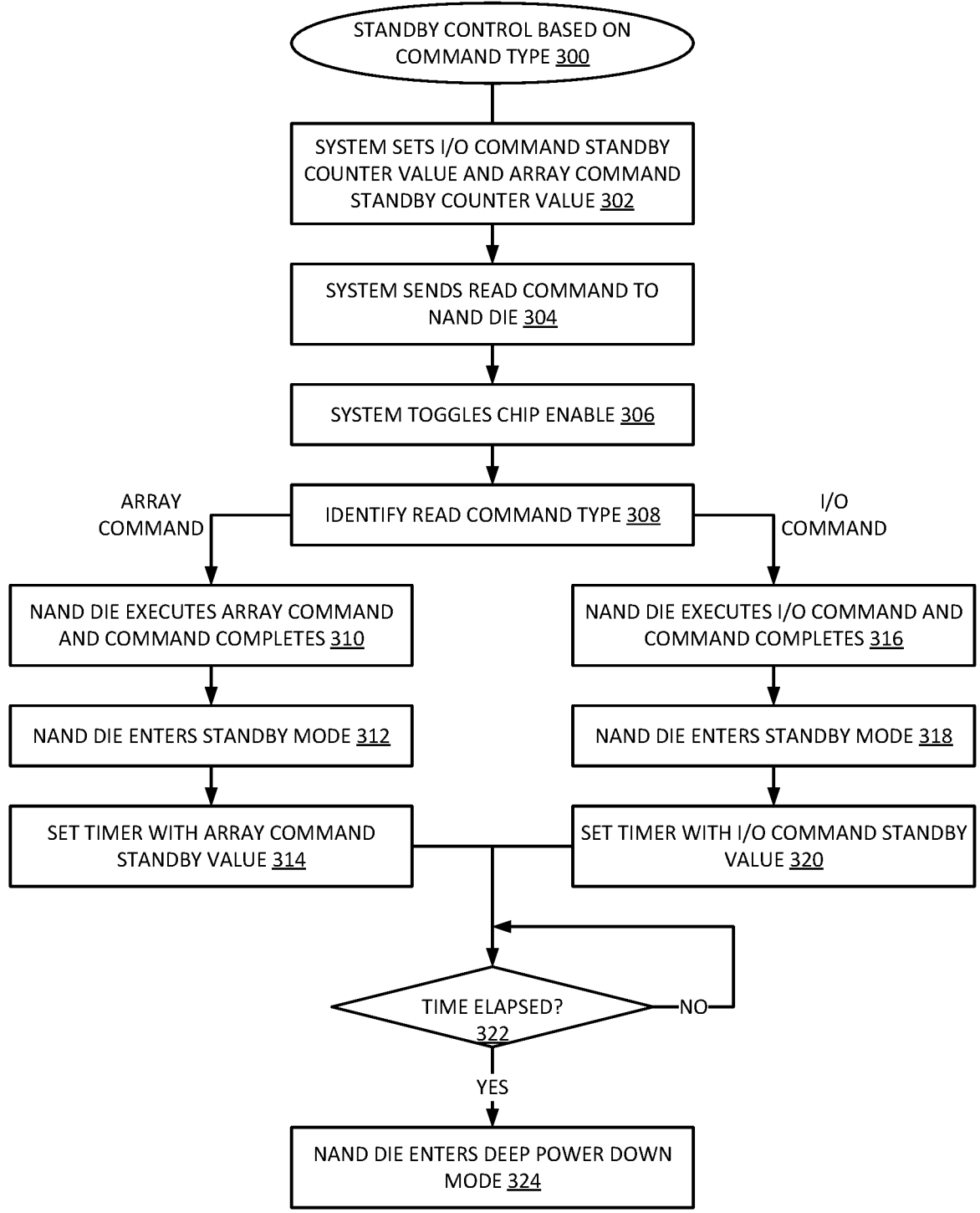
FIG. 3 is a flow diagram of an example of a process for transitioning from standby to deep power down based on command type.

FIG. 3 is a flow diagram of an example of a process for transitioning from standby to deep power down based on command type. Process 300 represents a standby control process to control transitioning a memory die from standby to DPD based on a type of command that has completed. Process 300 can be implemented by any example of standby control of system 100, and represents an example of a process in accordance with process 200 of FIG. 2.

In one example, the system sets a standby counter or standby timer, with different values set for I/O commands and array commands, block 302. The standby counter can indicate how long to stay in standby prior to transitioning to a DPD state, where the amount of time is different depending on the type of command that was completed prior to entering standby. In one example, the time to stay in standby is shorter after an I/O command than after an array command. An I/O command could alternatively be referred to as a DMA (direct memory access) command. A DMA command can operate directly from the memory, which can reduce the need for buffering data as long as an array command. Thus, an array command may be more reliant on the data in the buffer than an I/O command, which suggests keeping the die in standby longer to avoid losing the data in the buffer for the array command, whereas the I/O command may not have the same concern for buffer data.

In one example, the system sends a read command to the NAND die or other nonvolatile memory, block 304. The system can toggle a chip enable or other enable signal to identify the die that should execute the command, block 306. The NAND die receives and executes the command and identifies the type of command to execute, block 308. The identification of command type can include a command encoding in the command signal sent. For purposes of process 300, the process distinguishes array commands from I/O commands. In general, the storage device can distinguish between any two types of commands that result in a need to maintain buffered data for a longer period of time. Other commands for NAND or for other nonvolatile memory technologies can have distinctions between how much time they need between command or how much time data associated with the command should be buffered. For any such distinction, the system can adjust standby timing based on the command type received.

In one example, the NAND die executes an array command and the command completes, block 310. The NAND die can enter standby mode or standby state after the array command, block 312. In one example, the NAND sets the timer or threshold based on the array command standby value, block 314.

In one example, the NAND die executes an I/O command and the command completes, block 316. The NAND die can enter standby mode or standby state after the I/O command, block 318. In one example, the NAND sets the timer or threshold based on the I/O command standby value, block 320.

After entering standby and setting the appropriate threshold for transitioning from standby to DPD, the NAND can track the time in standby. If the time indicated has not elapsed, block 322 NO branch, the storage device leaves the NAND die in standby. In one example, in response to the time elapsing, block 322 YES branch, the NAND die enters DPD mode, block 324. The amount of time in standby mode will depend on the command type in process 300.

In one example, the transition to DPD can be referred to as an internal deep power down (IDPD), referring to the fact that the storage device itself determines when to enter DPD. In one example, a multi-die per channel NAND read is an exception to the transition from standby to DPD. In one example, the device will put a NAND die in IDPD mode only after an I/O or DMA command, and not after an array command. The distinction between the two command types can be accomplished by setting a high threshold for the standby counter that will effectively prevent it from entering DPD between commands. Such a flow could look something like the following for an array read:

Enable die 0;
Read die 0, with a latency of tRD (or tR);
Disable die 0 to place die 0 in standby (SBY) after tRD;
Make the standby threshold time, tSTY, high enough that die 0 will not transition to DPD.

The sequence can be repeated for all N dies in the NAND device.

The sequence for a DMA or I/O read could be as follows:
Enable die 0;
Read die 0, with a latency of tRD (or tR);
Disable die 0 to place die 0 in standby (SBY) after tRD;
After time tSTY, place die 0 in DPD.

The sequence can be repeated for all N dies in the NAND device.

Figure 4:
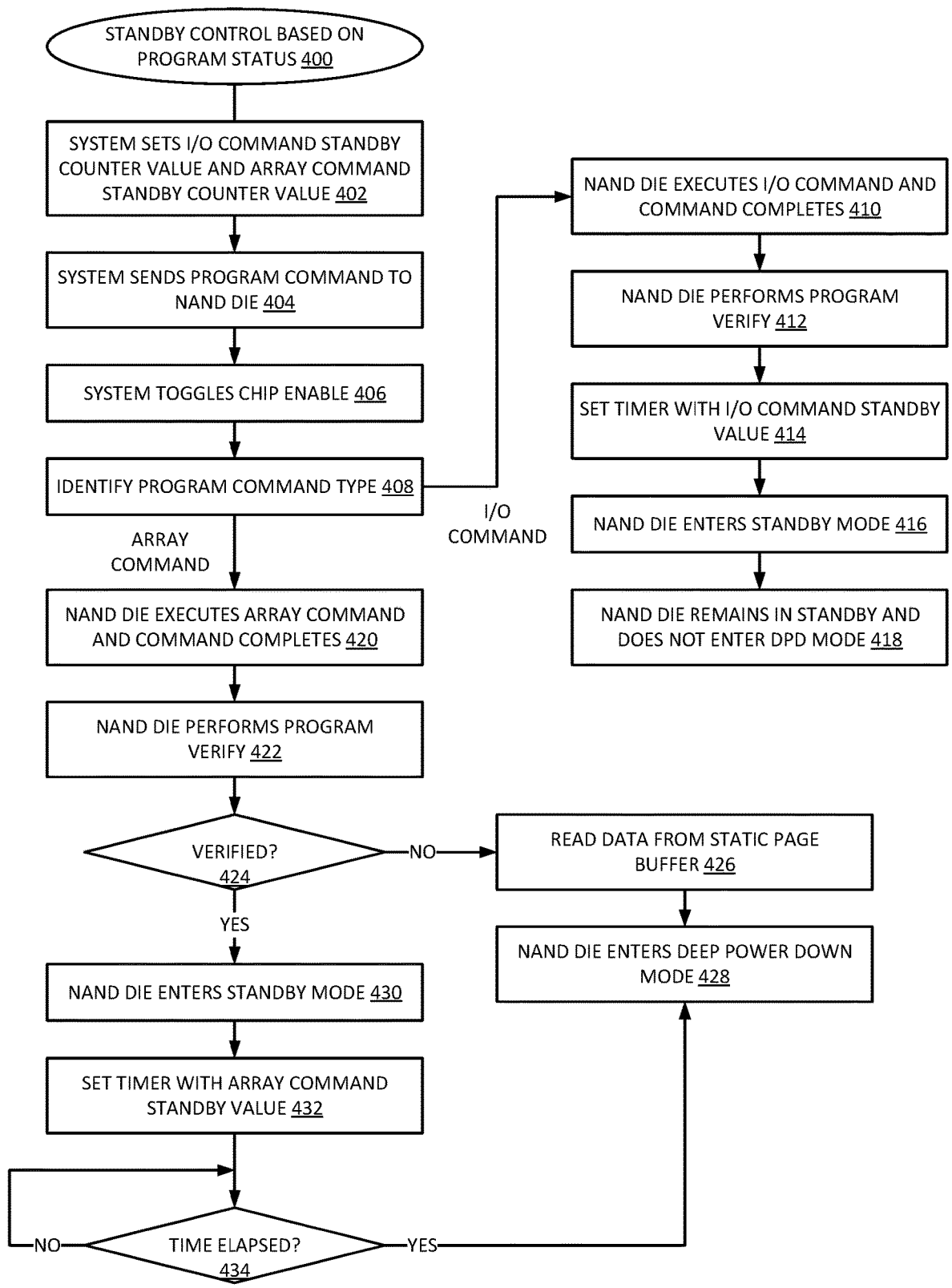
FIG. 4 is a flow diagram of an example of a process for transitioning from standby to deep power down based on program verify status.

FIG. 4 is a flow diagram of an example of a process for transitioning from standby to deep power down based on program verify status. Process 400 represents a standby control process to control transitioning a memory die from standby to DPD based on status of a program operation. Process 400 can be implemented by any example of standby control of system 100, and represents an example of a process in accordance with process 200 of FIG. 2.

In one example, the system sets a standby counter or standby timer, with different values set for I/O commands and array commands, block 402. The standby counter can indicate how long to stay in standby prior to transitioning to a DPD state, where the amount of time is different depending on the type of command that was completed prior to entering standby.

In one example, the system sends a program command to the NAND die or other nonvolatile memory, block 404. The system can toggle a chip enable or other enable signal to identify the die that should execute the command, block 406. The NAND die receives and executes the command and identifies the type of command to execute, block 408.

In one example, the NAND die executes an I/O command and the command completes, block 410. The NAND die performs a program verify to ensure the data was written correctly, block 412. In one example, the NAND die sets the timer or threshold based on the I/O command standby value, block 414, and the NAND die enters standby mode, block 416. In one example, the NAND die remains in standby and does not transition to DPD mode, 418. For example, the value of the timer could keep the NAND die in standby.

In one example, the NAND die executes an array command and the command completes, block 420. The NAND die performs a program verify to ensure the data was written correctly, block 422. In one example, the standby status after an array program will depend on the success of the verify operation. In one example, if program verify fails, block 424 NO branch, the NAND die reads data from the static page buffer, block 426. After reading from the SPB, the NAND die can enter DPD mode, 428.

In one example, if program verify succeeds, block 424 YES branch, the NAND die enters standby mode, block 430. In one example, the NAND sets the timer or threshold based on the array command standby value, block 432. After entering standby and setting the appropriate threshold for transitioning from standby to DPD, the NAND can track the time in standby. If the time indicated has not elapsed, block 434 NO branch, the storage device leaves the NAND die in standby. In one example, in response to the time elapsing, block 434 YES branch, the NAND die enters DPD mode, block 428.

Process 400 illustrates a distinction in standby operation based on both status of the command and program verify. Such a sequence for an I/O or DMA program could be as follows:

Enable die 0;
Program die 0 (tIO+tPROG);
Put die 0 in SBY after tIO plus tPROG;
Make the standby threshold time, tSTY, high enough that die 0 will not transition to DPD.

The sequence can be repeated for all N dies in the NAND device.

Such a sequence for an array program could be as follows:
Enable die 0;
Check status;
If the status passes, disable die 0 to place die 0 in standby (SBY) after tPROG;
If the program status fails, read data from SPB, and then put die 0 in DPD mode.

The sequence can be repeated for all N dies in the NAND device.

These sequences can mitigate data loss from the SPB after DPD mode. Thus, an exception to IDPD after multi-die per channel NAND program can be to put the NAND die in DPD mode only after checking status.

Figure 5A:
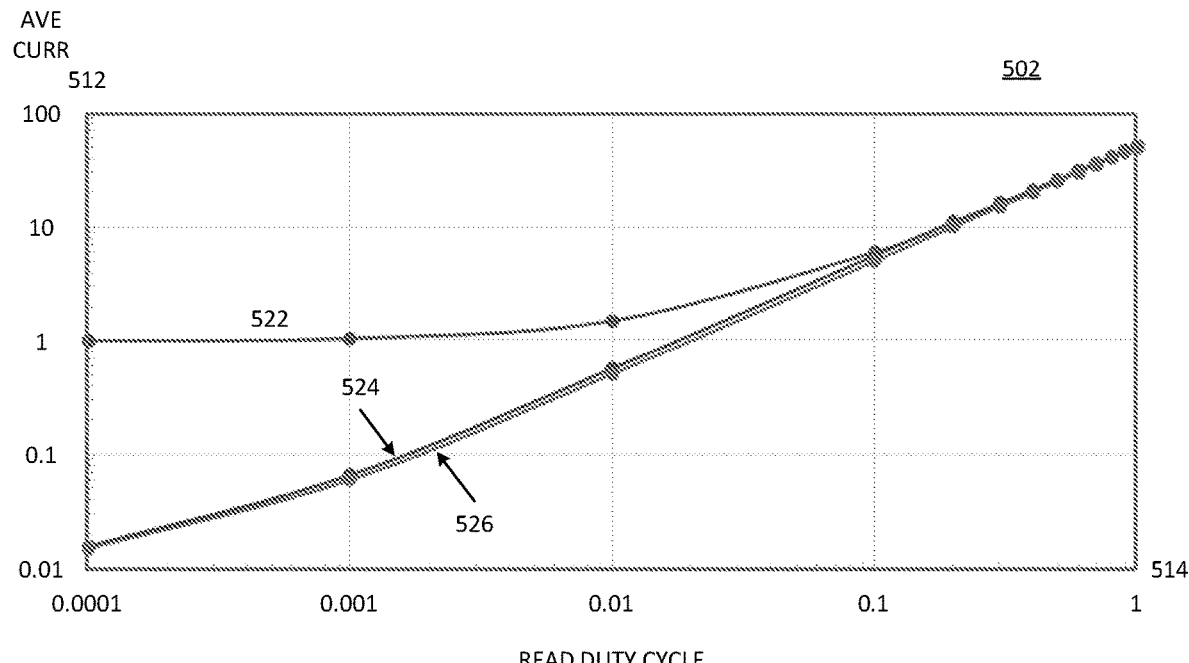
FIG. 5A is a diagrammatic representation of an example of average current versus read duty cycle for a system that controls transition from standby to deep power down.

FIG. 5A is a diagrammatic representation of an example of average current versus read duty cycle for a system that controls transition from standby to deep power down. Diagram 502 represents a simulation of the average current (axis 512) as a function of read duty cycle (axis 514). Curve 522 represents the case of the high leakage current with a traditional approach of only leaving the NAND die in standby mode. Curve 526 is the bottom curve, which lines up almost the same as curve 524. Curve 526 is slightly lower than curve 524. Curve 526 represents the case of a low leakage current, or the case of circuitry that has low standby leakage. As can be seen with curve 524, the application of a hybrid standby and DPD mode makes high leakage circuitry have results comparable to that of a low leakage case, very different from the high leakage traditional approach. In diagram 502, the average current is plotted as a function of read duty cycle for the case corresponding to t_timer=5×t_read. It will be observed that since the scale of axis 512 is logarithmic, the current different at low duty cycle for curve 524 is greater than 10× improvement over curve 522, and up to almost 100× improvement at very low duty cycles.

Figure 5B:
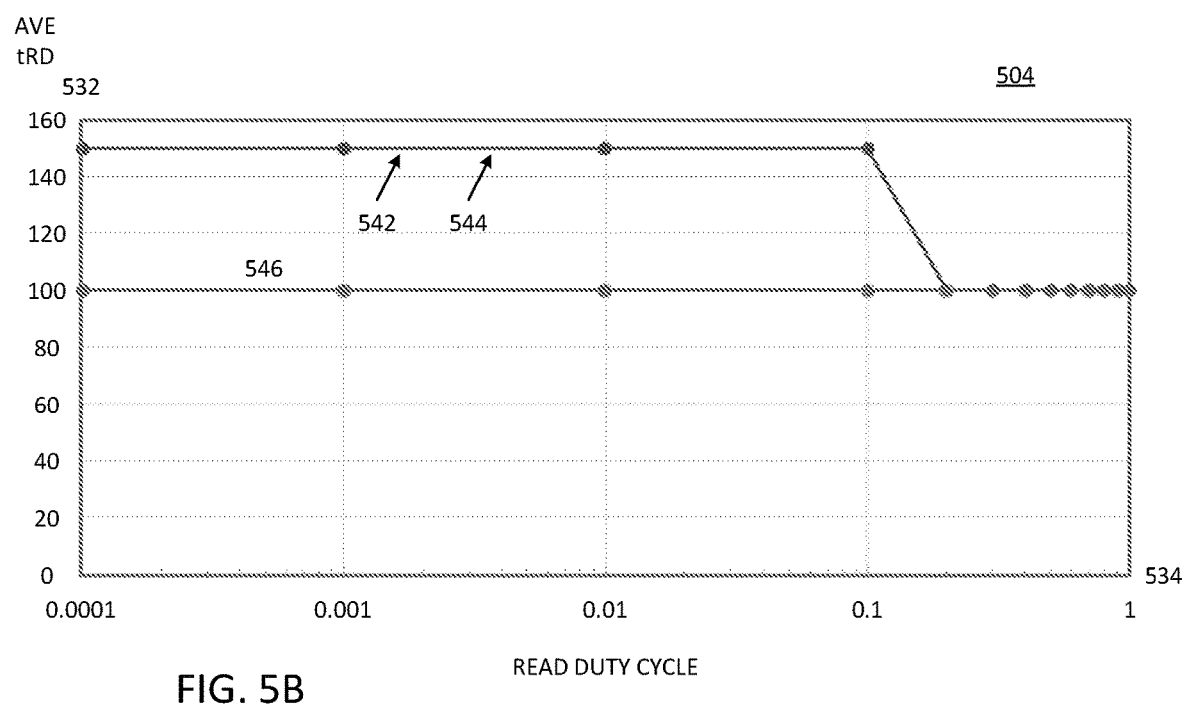
FIG. 5B is a diagrammatic representation of an example of average read time versus read duty cycle for a system that controls transition from standby to deep power down.

FIG. 5B is a diagrammatic representation of an example of average read time versus read duty cycle for a system that controls transition from standby to deep power down. Diagram 504 represents a simulation of the average t_read (tRD) (axis 532) as a function of read duty cycle (axis 534). Curve 542 represents the case of the high leakage current with a traditional approach of only leaving the NAND die in standby mode. Curve 542 lines up exactly with curve 544, which represent the case of a high leakage current with the application of a hybrid standby and DPD mode. Curve 546 represents the case of circuitry with low standby leakage current and a traditional method of staying in standby.

In diagram 504, the average t_read is plotted as a function of read duty cycle for the case corresponding to t_timer=5× t_read. As seen from the fact that curve 544 lines up with curve 542, the application of the hybrid standby and DPD mode does not impact the t_read compared to the traditional high leakage case. As seen from curves 542 and 544, the average t_read for the high leakage case is equal to the low leakage case when the read duty cycle is greater than 20% (duty cycle at 0.2 or higher), and it only increases moderately during light workloads when t_read is less critical.

Figure 6A:
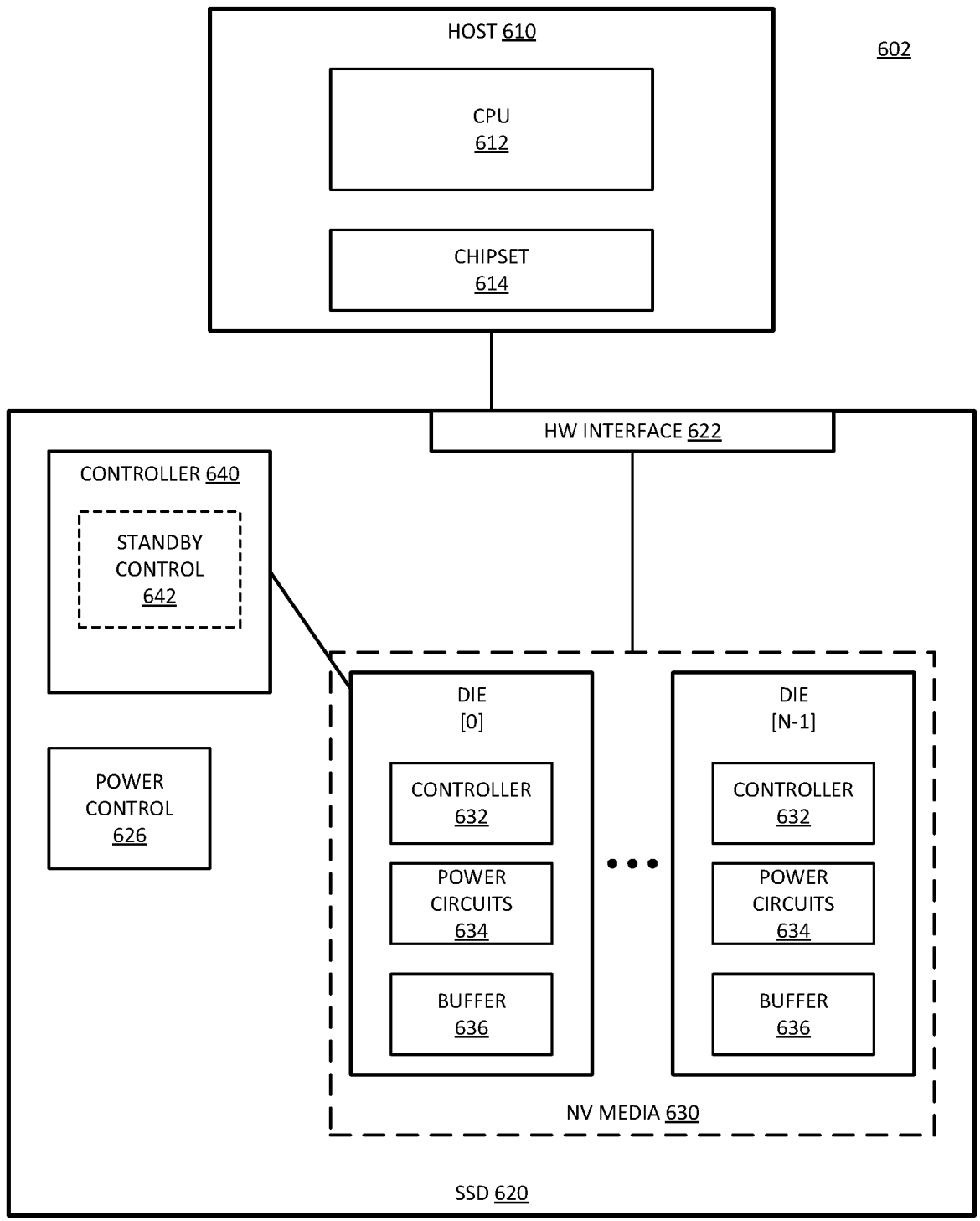
FIG. 6A is a block diagram of an example of a system with a solid state drive (SSD) with logic to transition from standby to deep power down.

FIG. 6A is a block diagram of an example of a system with a solid state drive (SSD) with logic to transition from standby to deep power down. System 602 represents components consistent with system 100 of FIG. 1. System 602 includes SSD 620 coupled with host 610. Host 610 represents a host hardware platform that connects to SSD 620. Host 610 includes CPU (central processing unit) 612 or other processor as a host processor. CPU 612 represents any host processor that generates requests to access data stored on SSD 620, either to read the data or to write data to the storage. Such a processor can include a single or multicore processor, a primary processor for a computing device, a graphics processor, a peripheral processor, or a supplemental or auxiliary processor, or a combination. CPU 612 can execute a host OS and other applications to cause the operation of system 602.

Host 610 includes chipset 614, which represents hardware components that can be included in connecting between CPU 612 and SSD 620. For example, chipset 614 can include interconnect circuits and logic to enable access to SSD 620. Thus, host platform 610 can include a hardware platform drive interconnect to couple SSD 620 to host 610. Host 610 includes hardware to interconnect to the SSD. Likewise, SSD 620 includes corresponding hardware to interconnect to host 610. In one example, chipset 614 includes a storage controller, which is a host-side controller that is separate from controller 640 within SSD 620.

SSD 620 represents a solid-state drive that includes nonvolatile (NV) media to store data. SSD 620 includes HW (hardware) interface 622 represents hardware components to interface with host 610. For example, HW interface 622 can interface with one or more buses to implement a high speed interface standard such as NVMe or PCIe.

In one example, SSD 620 includes NV (nonvolatile) media 630 as the primary storage for SSD 620. In one example, NV media 630 is implemented as multiple dies, illustrated as N dies, Die[0:{N-1}]. N can be any number of devices, and is often a binary number. SSD 620 includes controller 640 to control access to NV media 630. Controller 640 represents hardware and control logic within SSD 620 to execute control over the media. In one example, controller 640 includes standby control 642, which enables SSD 620 to selectively, internally transition NV media dies from a standby state to a DPD state, in accordance with any description provided.

It will be understood that system 602 does not represent all components of the SSD. NV media 630 is illustrated with controller 632 in each die, which represents control logic within the die. The control logic could include CMOS circuitry with high leakage in standby.

SSD 620 includes power control 626, which represents hardware to provide power to the components of SSD 620. Each NV die includes power circuits 634 to selectively enable and disable components of the die to enter a standby state or a deep power down state. Power circuits 634 can operate responsive to standby control 642. In one example, power control 626 can also provide power control for individual NV dies.

The NV dies include buffers 636, which represent buffers for selected access operations. In one example, controller 632 monitors the status of data in buffers 636 to determine how to transition from standby to DPD, or whether to not transition to DPD from standby. While not specifically shown, it will be understood that in one example, each NV die can include a standby timer to control the transition from standby to DPD.

Figure 6B:
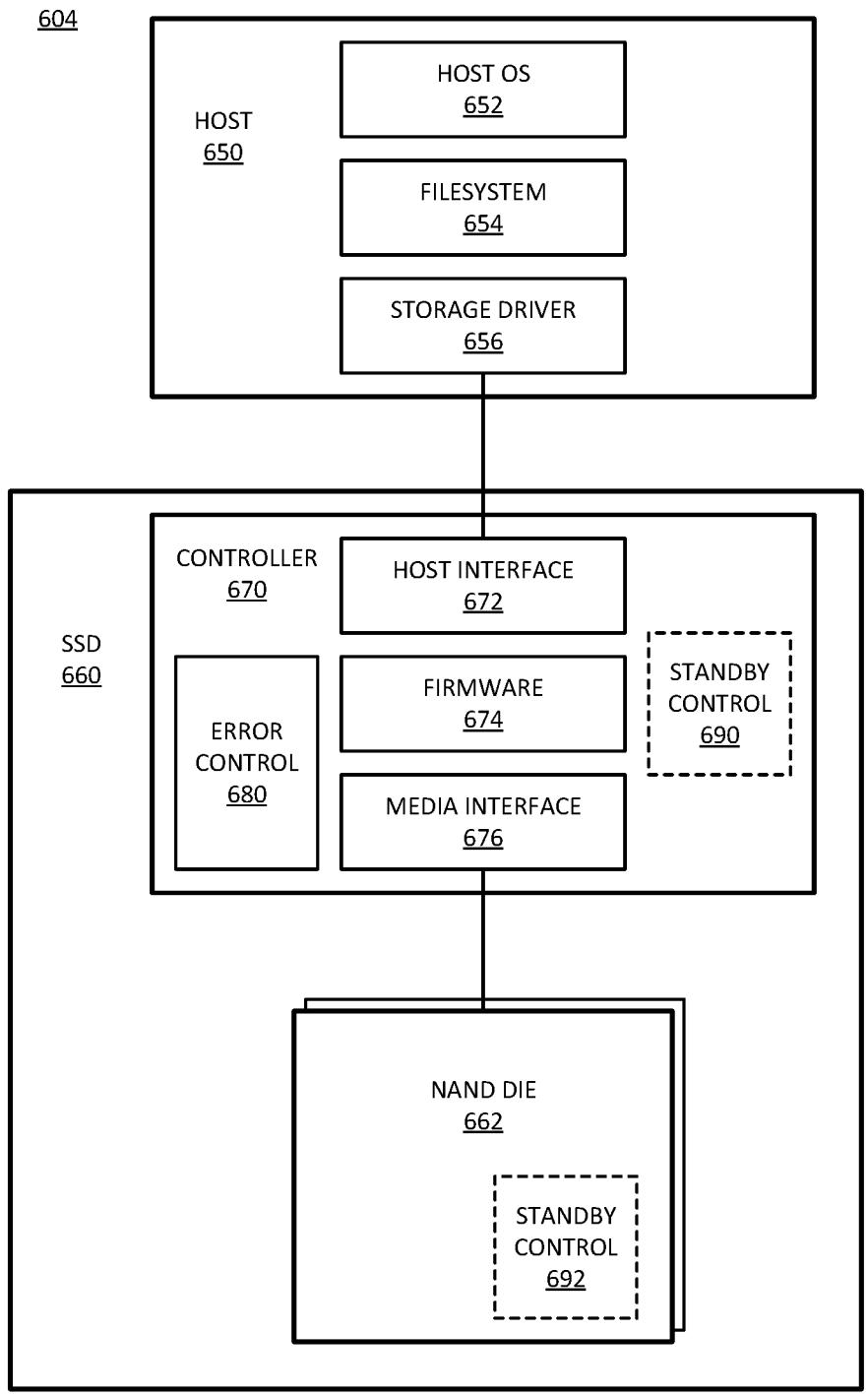
FIG. 6B is a block diagram of an example of a system with a solid state drive (SSD) with standby logic in the controller or in a NAND die to transition from standby to deep power down.

FIG. 6B is a block diagram of an example of a system with a solid state drive (SSD) with standby logic in the controller or in a NAND die to transition from standby to deep power down. System 604 provides one example of a system in accordance with system 602 of FIG. 6A. System 604 illustrates the logical layers of the host and SSD of a hardware platform in accordance with system 602. System 604 can represent software and firmware components of an example of system 602, as well as physical components. In one example, host 650 provides one example of host 610. In one example, SSD 660 provides one example of SSD 620.

In one example, host 650 includes host OS 652, which represents a host operating system or software platform for the host. Host OS 652 can include a platform on which applications, services, agents, and/or other software executes, and is executed by a processor. Filesystem 654 represents control logic for controlling access to the NV media. Filesystem 654 can manage what addresses or memory locations are used to store what data. There are numerous filesystems known, and filesystem 654 can implement known filesystems or other proprietary systems. In one example, filesystem 654 is part of host OS 652.

Storage driver 656 represents one or more system-level modules that control the hardware of host 650. In one example, drivers 656 include a software application to control the interface to SSD 660, and thus control the hardware of SSD 660. Storage driver 656 can provide a communication interface between the host and the SSD.

Controller 670 of SSD 660 includes firmware 674, which represents control software/firmware for the controller. In one example, controller 670 includes host interface 672, which represents an interface to host 650. In one example, controller 670 includes media interface 676, which represents an interface to NAND die 662 and NV media 664. Media interface 676 represent control that is executed on hardware of controller 670. It will be understood that controller 670 includes hardware to interface with host 650, which can be considered to be controlled by host interface software/firmware 674. Likewise, it will be understood that controller 670 includes hardware to interface with NV media 664. In one example, code for host interface 672 can be part of firmware 674. In one example, code for media interface 676 can be part of firmware 674.

In one example, controller 670 includes error control 680 to handle data errors in accessed data, and corner cases in terms of compliance with signaling and communication interfacing. Error control 680 can include implementations in hardware or firmware, or a combination of hardware and software.

SSD 660 includes multiple NAND dies 662. In one example, NAND die 662 includes standby control 692, which could include all logic for implementing the standby transition from standby to DPD, or can include only a timer. In one example, controller 670 includes standby control 690 to implement the internal transitioning from standby to DPD. The transitioning can be in accordance with any example described.

Figure 7:
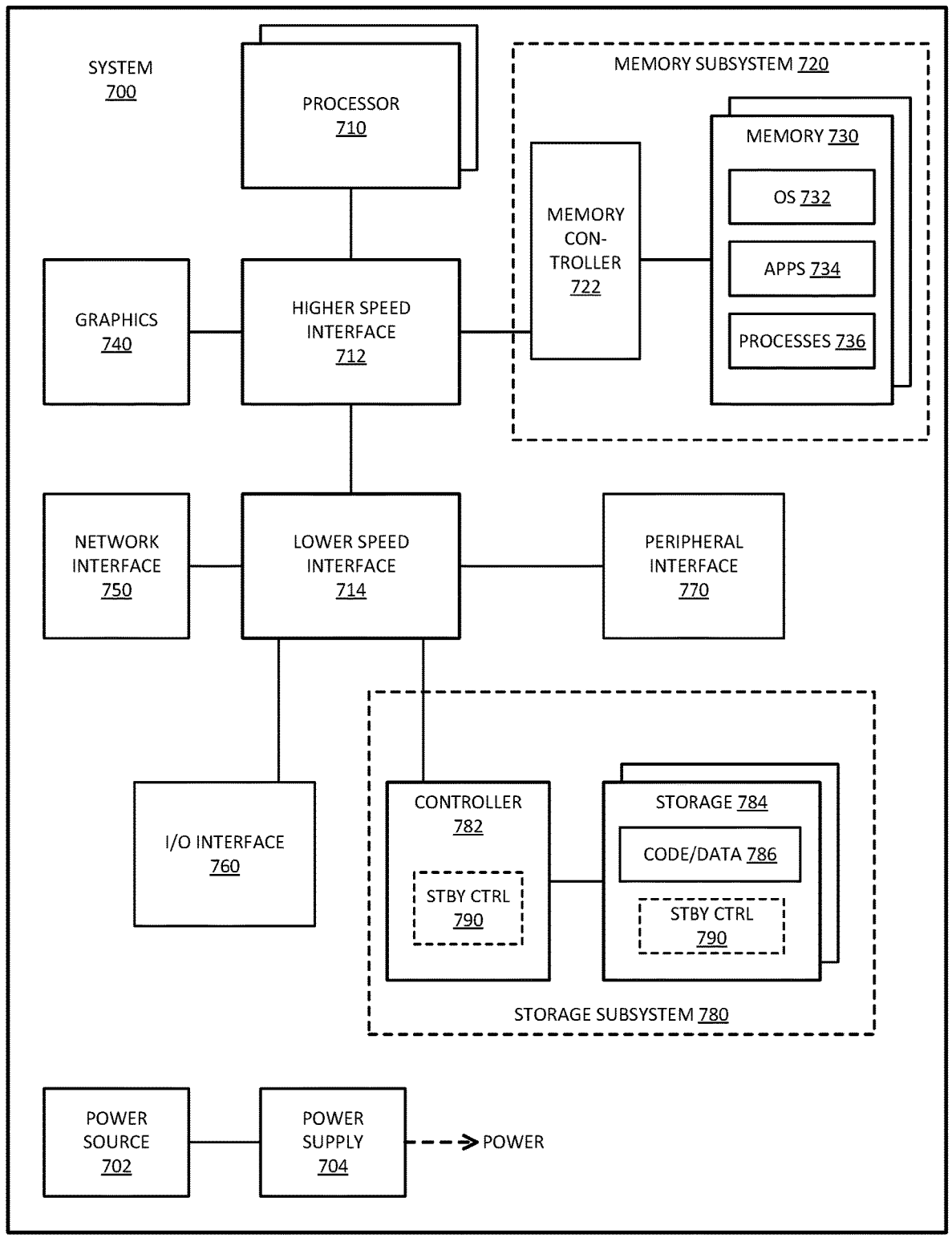
FIG. 7 is a block diagram of an example of a computing system in which transitioning from standby to deep power down can be implemented.

FIG. 7 is a block diagram of an example of a computing system in which transitioning from standby to deep power down can be implemented. System 700 represents a computing device in accordance with any example herein, and can be a laptop computer, a desktop computer, a tablet computer, a server, a gaming or entertainment control system, embedded computing device, or other electronic device. System 700 provides an example of a system in accordance with system 100.

In one example, storage subsystem 780 includes standby control 790. In one example, standby control 790 is included in storage device 784. In one example, standby control is included in controller 782. Standby control 790 enables system 700 to manage nonvolatile memory with a combination standby state and internal deep power down state, as opposed to a traditional standby state only. The transition from standby state to deep power down state can be in accordance with any example described.

System 700 includes processor 710 can include any type of microprocessor, central processing unit (CPU), graphics processing unit (GPU), processing core, or other processing hardware, or a combination, to provide processing or execution of instructions for system 700. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices. Processor 710 can be or include a multicore processor or a single core processor.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more memory devices 730 such as read-only memory (ROM), flash memory, one or more varieties of random access memory (RAM) such as DRAM, or other memory devices, or a combination of such devices. In one example, memory subsystem 720 includes nonvolatile memory in addition to volatile memory. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

In one example, storage subsystem 780 includes block addressable memory devices, such as NAND or NOR technologies. In one example, storage subsystem 780 includes byte addressable nonvolatile memory, such as a three dimensional crosspoint memory device, other byte addressable nonvolatile memory devices, or memory devices that use chalcogenide phase change material (e.g., chalcogenide glass), or that stores data based on a resistive state of the memory cell. In one example, the nonvolatile memory can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
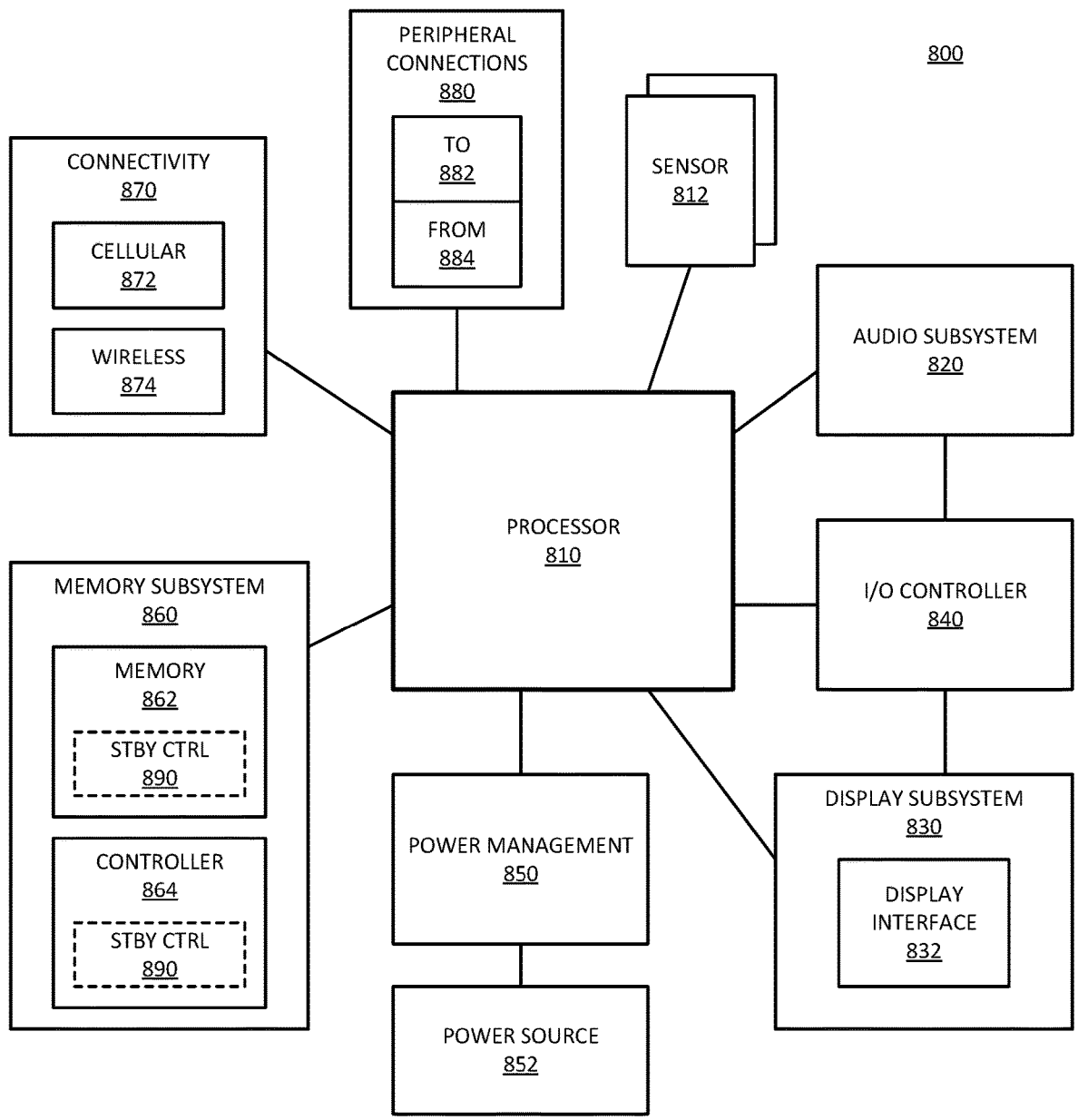
FIG. 8 is a block diagram of an example of a mobile device in which transitioning from standby to deep power down can be implemented.

FIG. 8 is a block diagram of an example of a mobile device in which transitioning from standby to deep power down can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800. System 800 provides an example of a system in accordance with system 100.

In one example, memory subsystem 860 includes standby control 890. In one example, standby control 890 is included in memory device 862. In one example, standby control 890 is included in controller 864. Standby control 890 enables system 800 to manage nonvolatile memory with a combination standby state and internal deep power down state, as opposed to a traditional standby state only. The transition from standby state to deep power down state can be in accordance with any example described.

System 800 includes processor 810, which performs the primary processing operations of system 800. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user. In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both.

Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a nonvolatile memory device includes: a memory die having nonvolatile memory cells, the memory die including circuitry having current leakage when the memory die is in a standby state where the memory die is ready to receive an access command to execute; and power gating circuitry to selectively transition the memory die from the standby state to a deep power down state, where the memory die is to ignore all access commands, in response to a trigger from a timer, the timer to track a standby time in response to entry of the memory die into the standby state, and the timer to trigger the transition to the deep power down state after a threshold time in the standby state.

In one example, the circuitry having current leaking comprises CMOS (complementary metal oxide semiconductor) control circuitry on the memory die. In one example, the threshold time is dynamically programmable. In one example, the threshold time is different for a standby state after an array command than for a standby after an I/O (input/output) command. In one example, the threshold time is shorter for the standby after the I/O command. In one example, the nonvolatile memory cells include NAND (not AND) memory cells. In one example, the timer is part of the memory die. In one example, a storage controller to control multiple memory dies controls selective transition by the power gating circuitry. In one example, for standby after a program command, the timer is to track the standby time only if a program operation is verified for the program command. In one example, the threshold time comprises at least five times a read time for the memory die.

In general with respect to the descriptions herein, in one example a system includes: multiple dies having nonvolatile memory cells, the memory dies including circuitry having current leakage when the memory die is in a standby state where the memory die is ready to receive an access command to execute; and a timer to track a standby time in response to entry of one of the multiple dies into the standby state, the timer to trigger a transition of the one of the multiple dies to a deep power down state after a threshold time in the standby state, wherein the memory die is to ignore all access commands in the deep power down state.

In one example, the circuitry having current leaking comprises CMOS (complementary metal oxide semiconductor) control circuitry on the memory die. In one example, the threshold time is dynamically programmable. In one example, the threshold time is different for a standby state after an array command than for a standby after an I/O (input/output) command. In one example, the threshold time is shorter for the standby after the I/O command. In one example, the nonvolatile memory cells include NAND (not AND) memory cells. In one example, the timer is part of the multiple dies, where each die includes a separate standby timer. In one example, the system of further includes a storage controller to manage access to the multiple dies, wherein the storage controller is to control selective transition of the memory dies from the standby state to the deep power down state. In one example, for standby after a program command, the timer is to track the standby time only if a program operation is verified for the program command. In one example, the threshold time comprises at least five times a read time for the memory die. In one example, the system further includes one or more of: a host processor device coupled to the multiple dies; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A nonvolatile memory device comprising:
   a memory die having nonvolatile memory cells, the memory die including circuitry having current leakage when the memory die is in a standby state where the memory die is ready to receive an access command to execute; and
   power gating circuitry to selectively transition the memory die from the standby state to a deep power down state, where the memory die is to ignore all access commands, in response to a trigger from a timer, the timer to track a standby time in response to entry of the memory die into the standby state, the timer to trigger the transition to the deep power down state based on an amount of time in the standby state, the amount of time based on command type.

2. The nonvolatile memory device of claim 1, wherein the circuitry having current leaking comprises CMOS (complementary metal oxide semiconductor) control circuitry on the memory die.

3. The nonvolatile memory device of claim 1, wherein the amount of time is dynamically programmable.

4. The nonvolatile memory device of claim 1, wherein the nonvolatile memory cells include NAND (not AND) memory cells.

5. The nonvolatile memory device of claim 1, wherein the timer is part of the memory die.

6. The nonvolatile memory device of claim 1, wherein a storage controller to control multiple memory dies controls selective transition by the power gating circuitry.

7. The nonvolatile memory device of claim 1, wherein for standby after a program command, the timer is to track the standby time only if a program operation is verified for the program command.

8. The nonvolatile memory device of claim 1, wherein the amount of time comprises at least five times a read time for the memory die.

9. A system, comprising:
multiple memory dies having nonvolatile memory cells, the memory dies including circuitry having current leakage when the memory die is in a standby state where the memory die is ready to receive an access command to execute; and
a timer to track a standby time in response to entry of one of the multiple dies into the standby state, the timer to trigger a transition of the one of the multiple memory dies to a deep power down state after a amount of time in the standby state, wherein the memory die is to ignore all access commands in the deep power down state and the amount of time is based on command type.

10. The system of claim 9, wherein the circuitry having current leaking comprises CMOS (complementary metal oxide semiconductor) control circuitry on the memory die.

11. The system of claim 9, wherein the amount of time is dynamically programmable.

12. The system of claim 9, wherein the amount of time is different for a standby state after an array command than for a standby after an I/O (input/output) command.

13. The system of claim 12, wherein the amount of time is shorter for the standby after the I/O command.

14. The system of claim 9, wherein the timer is part of the multiple memory dies, where each die includes a separate standby timer.

15. The system of claim 9, further comprising a storage controller to manage access to the multiple memory dies, wherein the storage controller is to control selective transition of the memory dies from the standby state to the deep power down state.

16. The system of claim 9, wherein for standby after a program command, the timer is to track the standby time only if a program operation is verified for the program command.

17. The system of claim 9, wherein the amount of time comprises at least five times a read time for the memory die.

18. The system of claim 9, further comprising one or more of:
a host processor device coupled to the multiple dies;
a display communicatively coupled to a host processor;
a network interface communicatively coupled to a host processor; or
a battery to power the system.

19. A nonvolatile memory device comprising:
a memory die having nonvolatile memory cells, where the memory die is ready to receive an access command to execute; and
power gating circuitry to selectively transition the memory die from a standby state to a deep power down state, where the memory die is to ignore all access commands, in response to a trigger from a timer, the timer to track a standby time in response to entry of the memory die into the standby state, the timer to trigger the transition to the deep power down state based on an amount of time in the standby state, wherein:
the amount of time is different for a standby state after an array command than for a standby after an I/O (input/output) command.

20. The nonvolatile memory device of claim 19, wherein a storage controller to control multiple memory dies controls selective transition by the power gating circuitry.

21. The nonvolatile memory device of claim 19, wherein the amount of time is shorter for the standby after the I/O command.

* * * * *